(12) United States Patent
Yeh et al.

(10) Patent No.: US 11,637,188 B2
(45) Date of Patent: Apr. 25, 2023

(54) NON-VOLATILE MEMORY DEVICE AND METHOD FOR FABRICATING THE SAME

(71) Applicant: UNITED MICROELECTRONICS CORP., Hsinchu (TW)

(72) Inventors: Yu-Jen Yeh, Taichung (TW); Chih-Jung Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 103 days.

(21) Appl. No.: 17/226,431

(22) Filed: Apr. 9, 2021

(65) Prior Publication Data

US 2022/0271136 A1 Aug. 25, 2022

(30) Foreign Application Priority Data

Feb. 25, 2021 (CN) .......................... 202110212028.1

(51) Int. Cl.
*H10B 41/30* (2023.01)
*H01L 29/423* (2006.01)
*H01L 27/11521* (2017.01)
*H01L 29/51* (2006.01)
*H01L 29/66* (2006.01)
*H01L 29/78* (2006.01)
*H01L 29/788* (2006.01)
*H01L 21/265* (2006.01)
*H01L 21/28* (2006.01)

(52) U.S. Cl.
CPC .. *H01L 29/42336* (2013.01); *H01L 21/26513* (2013.01); *H01L 27/11521* (2013.01); *H01L 29/40114* (2019.08); *H01L 29/42328* (2013.01); *H01L 29/513* (2013.01); *H01L 29/517* (2013.01); *H01L 29/518* (2013.01); *H01L 29/66492* (2013.01); *H01L 29/66825* (2013.01); *H01L 29/7833* (2013.01); *H01L 29/7883* (2013.01)

(58) Field of Classification Search
None
See application file for complete search history.

(56) References Cited

U.S. PATENT DOCUMENTS

| 5,981,404 A * | 11/1999 | Sheng | ............... H01L 21/28238 438/791 |
|---|---|---|---|
| 9,019,764 B2 | 4/2015 | Lee et al. | |
| 9,761,310 B2 | 9/2017 | Hsu | |

(Continued)

*Primary Examiner* — Xiaoming Liu
(74) *Attorney, Agent, or Firm* — WPAT, PC

(57) ABSTRACT

An NVM device includes a semiconductor substrate, a first floating gate, a first control gate, a first drain region, and a common source region. The semiconductor substrate has a recess extending downward from the substrate surface. The first floating gate is disposed in the recess, has a base and a side wall connecting to the base. The first control gate is disposed on and adjacent to the first floating gate. The first drain region is disposed in the semiconductor substrate in the recess. The common source region is formed in the semiconductor substrate in the recess, is adjacent to the first floating gate, and includes a main body and an extension part. The main body is disposed below a bottom surface of the recess and adjacent to the base. The extension part extends upward from the bottom surface beyond the base to be adjacent to the side wall.

18 Claims, 6 Drawing Sheets

(56) References Cited

U.S. PATENT DOCUMENTS

| | | | |
|---|---|---|---|
| 10,163,509 B2 | 12/2018 | Hsu | |
| 10,347,773 B2 | 7/2019 | Si et al. | |
| 2017/0110469 A1* | 4/2017 | Yi | H01L 27/11578 |
| 2019/0140063 A1* | 5/2019 | Liu | H01L 29/0649 |

* cited by examiner

NON-VOLATILE MEMORY DEVICE AND METHOD FOR FABRICATING THE SAME

This application claims the benefit of People's Republic of China application Serial No. 202110212028.1 filed at Feb. 25, 2021, the subject matter of which is incorporated herein by reference.

BACKGROUND

Technical Field

The disclosure relates to a memory device and the method for fabricating the same, and more particularly to a non-volatile memory (NVM) device and the method for fabricating the same.

Description of Background

An NVM device, such as a floating gate flash memory device, is able to continually store information even when the supply of electricity is removed from the device and has been widespreadly adopted by bulk solid state memory applications for portable music players, mobile phones, and digital cameras.

A typical floating gate flash memory device includes a plurality of diffusion regions and isolation regions staggered along a first direction (for example, the x-axis direction) in the substrate; and further includes a plurality of gate structures (each of which includes a gate dielectric layer, a floating gate, a tunneling dielectric layer, and a control gate vertically stacked with each other) arranged respectively overlapping with one the diffusion regions and arranged along a second direction (for example, the y-axis direction) that is perpendicular to the first direction. Among them, each of the diffusion regions overlaps one of the gate structures. The portions of one diffusion region disposed on two opposite sides of its corresponding gate structure can respectively serve as a source region and a drain region; the source region, the drain region and the corresponding gate structure can collectively form a memory cell; and a plurality of memory cells that are formed on the substrate can constitute a memory cells array.

Usually, each drain region of the memory cells that are arranged in the same row can be connected to an external wire through an individual contact plug; and the source regions of these memory cells arranged in the same row may be connected in series through a common source line that is a doped region formed in an inner part of the substrate, to form a memory cell string. The common source line is then electrically connected to an external wire through a source contact plug arranged between two isolation structures.

Since the distance between the source contact plug and each of the source regions of the memory cells that are arranged in the same memory cell string may be different, thus the lengths of the doped regions respectively connecting the memory cells to the source contact plug may be different. Such that the resistance value measured between each of these memory cells and the source contact plug may vary, even these memory cells share the same common source line. When the source load of the memory cell string is changed (for example, when a read voltage is applied to these memory cells), the output (for example, read current) of each memory cell may be inconsistent with each other, due to the source loading effect, thereby the stability and reliability of the (reading) signal can be reduced, and the performance of these memory cells can be thus deteriorated (for example, causing the read failure of these memory cells).

Therefore, there is a need of providing an NVM device and the method for fabricating the same to obviate the drawbacks encountered from the prior art.

SUMMARY

One aspect of the present disclosure is to provide a NVM device, wherein the NVM device includes a semiconductor substrate, a first floating gate, a first control gate, a first drain region, and a common source region. The semiconductor substrate has a substrate surface and a recess extending downward from the substrate surface. The first floating gate is disposed in the recess, has a base and a side wall connecting to the base, and is electrically isolated from the semiconductor substrate. The first control gate is disposed on and adjacent to the first floating gate, and is electrically isolated from the semiconductor substrate and the first floating gate. The first drain region is disposed in a portion of the semiconductor substrate that is located in the recess. The common source region is formed in a portion of the semiconductor substrate disposed in the recess, is adjacent to the first floating gate, and includes a main body and an extension part. The main body is disposed below a bottom surface of the recess and adjacent to the base. The extension part extends upward from the bottom surface beyond the base to be adjacent to the side wall.

Another aspect of the present disclosure is to provide a method for fabricating an NVM device, wherein the method includes steps as follows: Firstly, a semiconductor substrate that has a substrate surface and a recess extending downward from the substrate surface is provided. Next, a floating gate is formed in the recess, which has a base and a side wall connecting to the base, and is electrically isolated from the semiconductor substrate. A control gate is formed to be adjacent to a top portion of the floating gate and electrically isolated from the semiconductor substrate and the floating gate. A drain region and a common source region are formed in a portion of the semiconductor substrate in the recess, so as to make the common source region to be adjacent to the floating gate and include a main body and an extension part. Wherein the main body is disposed below a bottom surface of the recess and adjacent to the base. The extension part extends upward from the bottom surface and beyond the base to be adjacent to the side wall.

In accordance with the aforementioned embodiments of the present disclosure, an NVM device and the method for fabricating the same are provided, in which a recess is formed in a semiconductor substrate, and a floating gate is then formed on the bottom surface of the recess. Next, a control gate is formed on the floating gate; and a common source region and a drain region are formed in the portion of the semiconductor substrate disposed in the recess, so as to make the common source region having a main body and an extension part. Wherein the main body is disposed under the bottom surface of the recess, and the extension part extends upward from the bottom surface of the recess beyond the base of the floating gate to be adjacent to the side wall of the floating gate. Whereby, at least one memory cell is formed in the semiconductor substrate.

Since the extension part protruding from the bottom surface of the recess can substantially enlarge the cross-sectional area of the source region of each memory cell, thus the conduction current of the source region can be increased, and the resistance of the source region can be reduced. When a plurality of memory cells are connected in series with their respective source regions to form a common source line, the negative impact of the source loading effect to the stability of each memory cell can be relatively reduced. In some embodiments, the doping concentration of the extension part of each memory cell can be further increased to reduce the resistance of the common source line, further reduce the source loading effect, and improve the performance of the NVM device.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
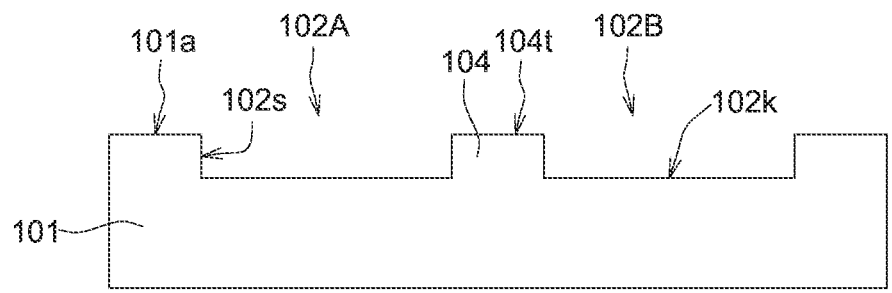
FIGS. 1A to 1L are schematic top views illustrating the partial structures and method for fabricating an NVM device, according to one embodiment of the present disclosure.

The embodiments as illustrated below provide an NVM device and the method for fabricating the same to reduce the negative impact of the source loading effect on the output stability of the memory cells. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIGS. 1A to 1L are schematic top views illustrating the partial structures and method for fabricating an NVM device 100, according to one embodiment of the present disclosure. The method for manufacturing the NVM device 100 includes the following steps: Firstly, a semiconductor substrate 101 that has a recess 102 extending downward from a surface 101a of the semiconductor substrate 100 is provided.

In some embodiments of the present disclosure, the semiconductor substrate 101 may be a substrate composed of semiconductor materials, such as silicon (Si), germanium (Ge), and gallium arsenide (GaAs). However, in other embodiments, the semiconductor substrate 101 may also be a silicon on insulator (SOI) substrate. In the present embodiment, the semiconductor substrate 101 is a silicon substrate, such as a silicon wafer.

The forming of the recess 102 includes steps as follows: A portion of the semiconductor substrate 101 may be removed using a photoresist (not shown) etching process performed on a substrate surface 101a to form the recess 102 extending downward from the substrate surface 101a; and a portion of the semiconductor substrate 101 can be left in the recess 102 to form a protrusion 104, which extends upward from a bottom surface 102k of the recess 102, and divides the recess 102 into a first sub-recess 102A and a second sub-recess 102B that are isolated from each other. In the present embodiment, the protrusion 104 has a top surface 104t that is substantially coplanar with the substrate surface 101a.

Next, at least one floating gate (for example, a first floating gate 105A and a second floating gate 105B) is formed in the recess 102, so as to make it (either the first floating gate 105A or the second floating gate 105B) having a base 105k and a sidewall 105s which connects to the base 105k, and be electrically isolated from the semiconductor substrate 101. In some embodiments of the present disclosure, prior to forming the at least one floating gate (i.e. the first floating gate 105A and the second floating gate 105B), a shallow trench isolation structure 106 may be formed in the recess 102 first.

Figure 1B:
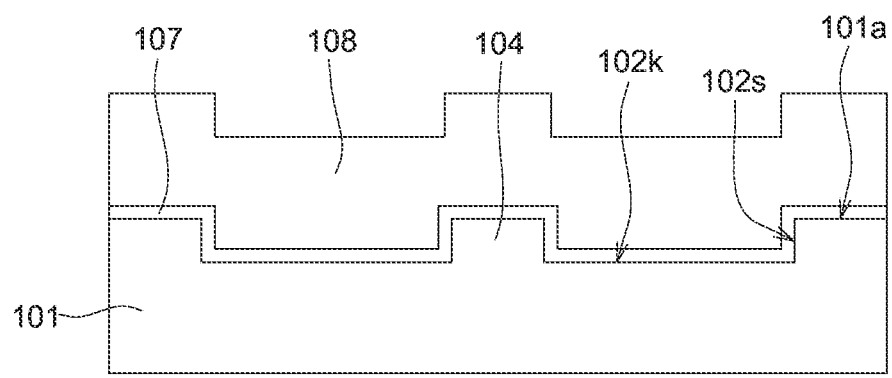

The forming of the shallow trench isolation structure 106 includes following steps: A thermal oxidation process is performed to form a pad silicon oxide layer 107 covering the substrate surface 101a, the sidewalls 102s and the bottom surface 102k of the recess 102, and the protrusion 104 formed in the recess 102. And a silicon nitride hard mask layer 108 is formed on the pad silicon oxide layer 107 (as shown in FIG. 1B).

Figure 1C:
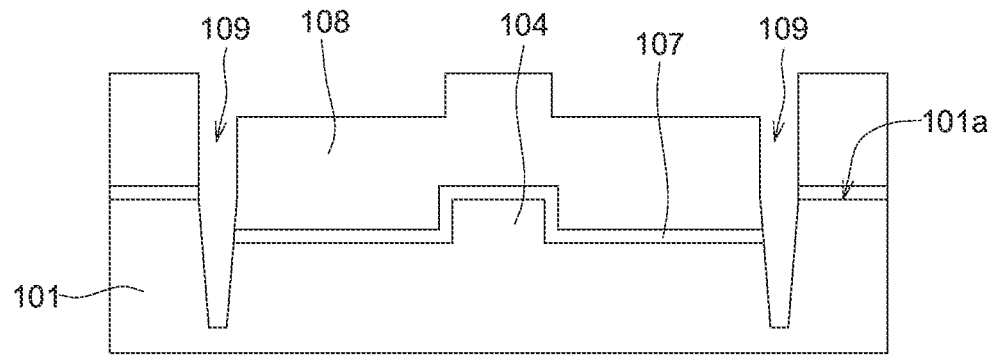
Figure 1D:
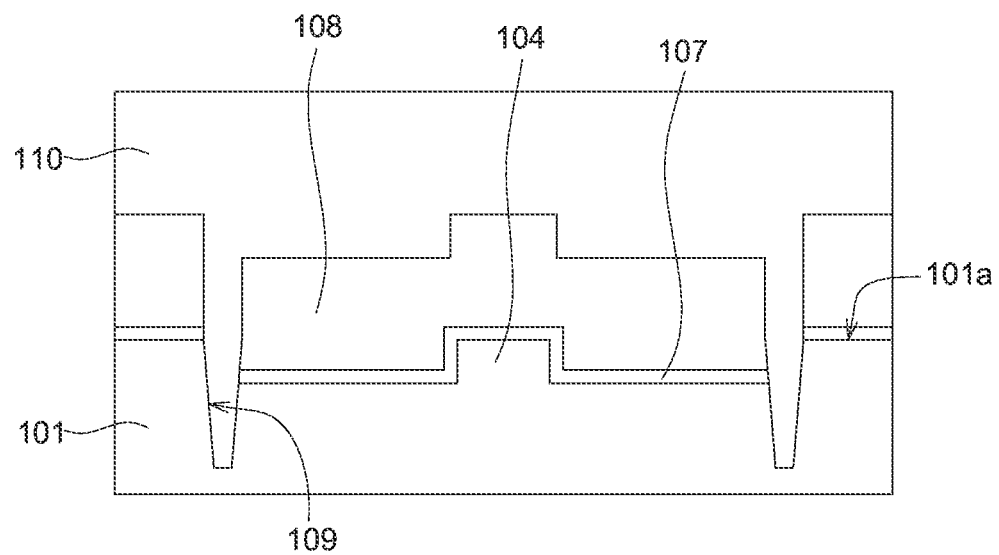
Figure 1E:
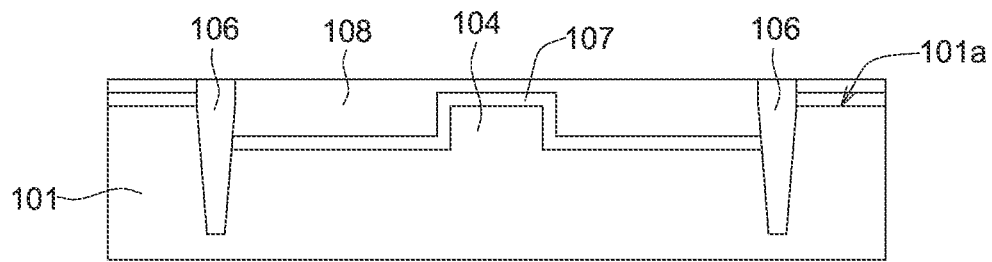

Next, the pad silicon oxide layer 107, the hard mask layer 108 and the semiconductor substrate 101 are patterned to form at least one trench 109 in the recess 102 (as shown in FIG. 1C). The at least one trench 109 are then filled with a dielectric material 110, such as silicon oxide (SiOx), silicon carbide (SiC), silicon oxycarbide (SiCO), silicon nitride (SiN), silicon oxynitride (SiNO) or other suitable materials 109 (as shown in FIG. 1D). Subsequently, a planarization manufacturing process, such as a mechanical polishing manufacturing process (CMP) using the pad silicon oxide layer 107 as a stop layer is then performed to remove portions of the dielectric material 110, the hard mask layer 108, and the pad silicon oxide layer 107, so as to form the shallow trench isolation structure 106 (as shown in FIG. 1E).

Figure 1F:
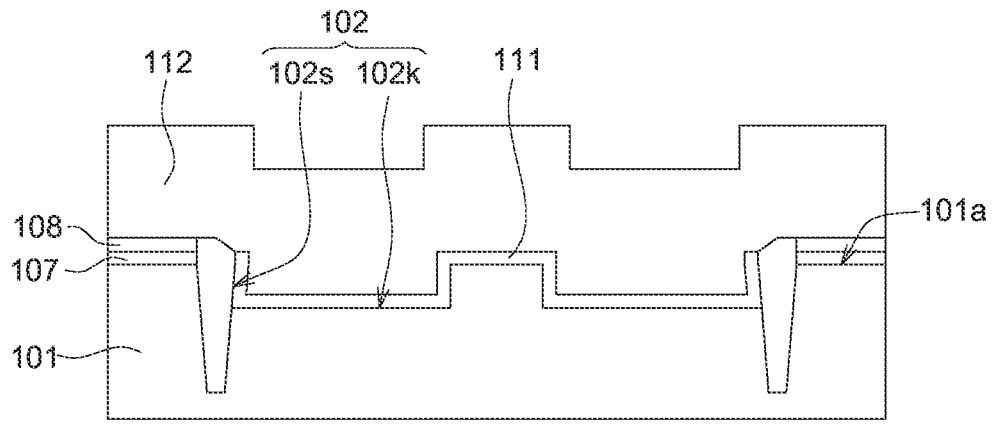
Figure 1G:
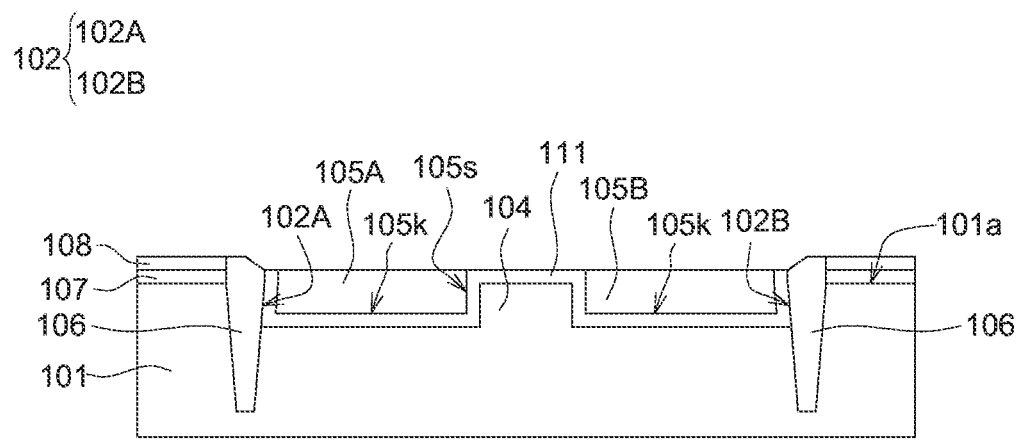

After removing the portions of the hard mask layer 108 and pad silicon oxide layer 107 left in the recess 102, a gate dielectric layer 111 is then formed on the substrate surface 101a by a deposition process, and covers the sidewall 102s (including a portion of the shallow trench isolation structure 106) and the bottom surface 102k of the recess 102; and a first conductive layer 112 is formed to cover the gate dielectric layer 111 (as shown in FIG. 1F). Another planarization manufacturing process (not shown) is performed to remove a portion of the first conductive layer 112 not being disposed in the recess 102. The portion of the first conductor layer 112 left in the recess 102 is then etched back, so as to form the first floating gate 105A and the first floating gate 105B that are electrically isolated from each other and respectively disposed in the first sub-recess 102A and the second sub-recess 102B (as shown in FIG. 1G). Wherein, each of the first floating gate 105A and the second floating gate 105B are electrically isolated from the semiconductor substrate 101 by the portions of the gate dielectric layer 111 covering the sidewall 102s and the bottom surface 102k of the recess 102; and has a base 105k adjacent to the protrusion 104 that is disposed in the recess 102.

The gate dielectric layer 111 can be made of a dielectric material, for example, silicon dioxide ($SiO_2$), silicon nitride (SiN), silicon oxynitride (SiNO), high-k dielectric materials (e.g., oxide ($HfO_2$), aluminum oxide ($AlO_x$)) or one of the arbitrary combinations thereof.

Figure 1H:
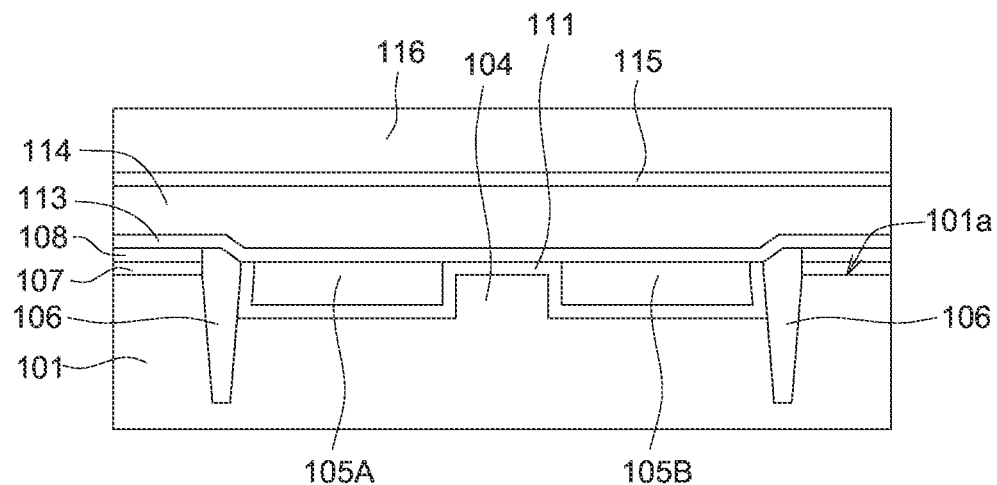

After the first floating gate 105A and the second floating gate 105B are formed, and a first control gate 103A and a second control gate 103B that are isolated from each other are respectively formed on and adjacent to the first floating gate 105A and the second floating gate 105B, so as to make the first floating g gate 105A and the second floating gate 105B both electrically isolated from the semiconductor substrate 101. In some embodiments of the present disclosure, the forming of the first control gate 103A and the second control gate 103B includes following steps: A dielectric memory layer 113 is firstly formed to cover the first floating gate 105A the second floating gate 105B and the protrusion 104; a second conductive layer 114 is \ formed to cover the dielectric memory layer 113; an oxide layer 115 is formed to cover the second conductive layer 114; and a hard mask layer 116 is formed to cover the oxide layer 115 (as shown in FIG. 1H).

In some embodiments of the present disclosure, the dielectric memory layer 113 includes at least one composite layer consisting of a silicon oxide layer, a silicon nitride layer and a silicon oxide layer (i.e., an ONO structure). However, the structure of the dielectric storage layer 113 is not limited to this regard. In some other embodiments of the present disclosure, the composite layer of the dielectric memory layer 113 can also be selected from a group consisting of an oxide-nitride-oxide-nitride-oxide (ON-ONO) structure, a silicon-oxide-nitride-oxide-silicon (SONOS) structure, a bandgap engineered silicon-oxide-nitride-oxide-silicon (BE-SONOS) structure, a tantalum nitride, aluminum oxide, silicon nitride, silicon oxide, silicon (TANOS) structure and a metal-high-k bandgap-engineered silicon-oxide-nitride-oxide-silicon (MA BE-SONOS) structure and the arbitrary combinations thereof.

Subsequently, a photolithography and etching process, using the dielectric storage layer 113 as a stop layer, is performed to remove portions of the hard mask layer 116, the oxide layer 115, and the second conductive layer 114, so as to form the first control gate 103A and the second control gate 103B respectively on the first floating gate 105A and the second floating gate 105B. Wherein each of the first control gate 103A and the second control gate 103B is formed by stacking a portion of the dielectric storage layer 113, a portion of the second conductive layer 114 and a portion of the hard mask layer 116. In the present embodiment, the first control gate 103A and the second control gate 103B are electrically isolated from each other.

Figure 1I:
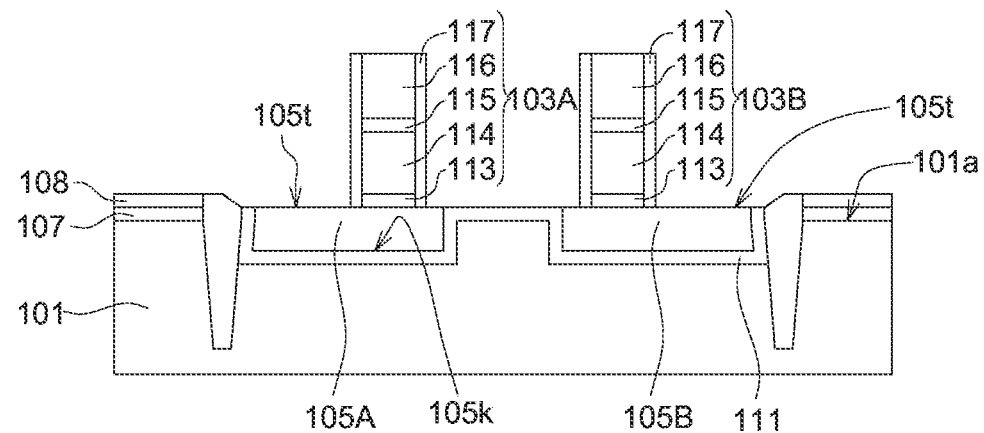

In addition, after forming the first control gate 103A and the second control gate 103B, at least one spacer 117 may be formed on the sidewalls of the first control gate 103A and the second control gate 103B, to respectively cover the tops 105t of the first floating gate 105A and the second floating gate 105B (as shown in FIG. 1I).

It should be appreciated that the spacer 117 can be a single-layer structure or a multilayer structure. In some embodiments, the layers for constituting the multilayer structure of the spacer 117 can be made of different materials, and can be formed on the sidewalls of the first control gate 103A and the second control gate 103B by different manufacturing processes.

Figure 1J:
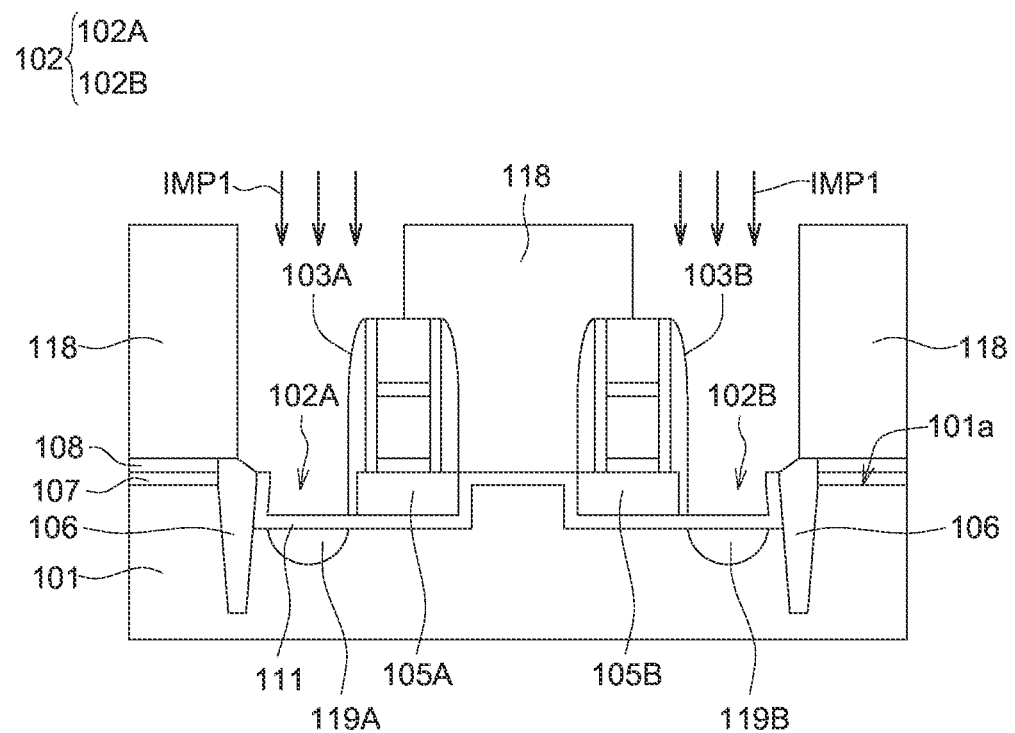

After the first control gate 103A and the second control gate 103B are formed, a patterned photoresist layer 118 is formed on the substrate 101 to expose portions of the bottom surface 102k (of the first sub-recess 102A and the second sub-recess 102B) that are not covered by the first floating gate 105A and the second floating gate 105B. And at least one ion implantation process IMP1 is then performed to respectively form a first drain region 119A and a second drain region 119B in the portions of the semiconductor substrate 101 under the exposed portions of the bottom surface 102k (as shown in FIG. 1J).

Figure 1K:
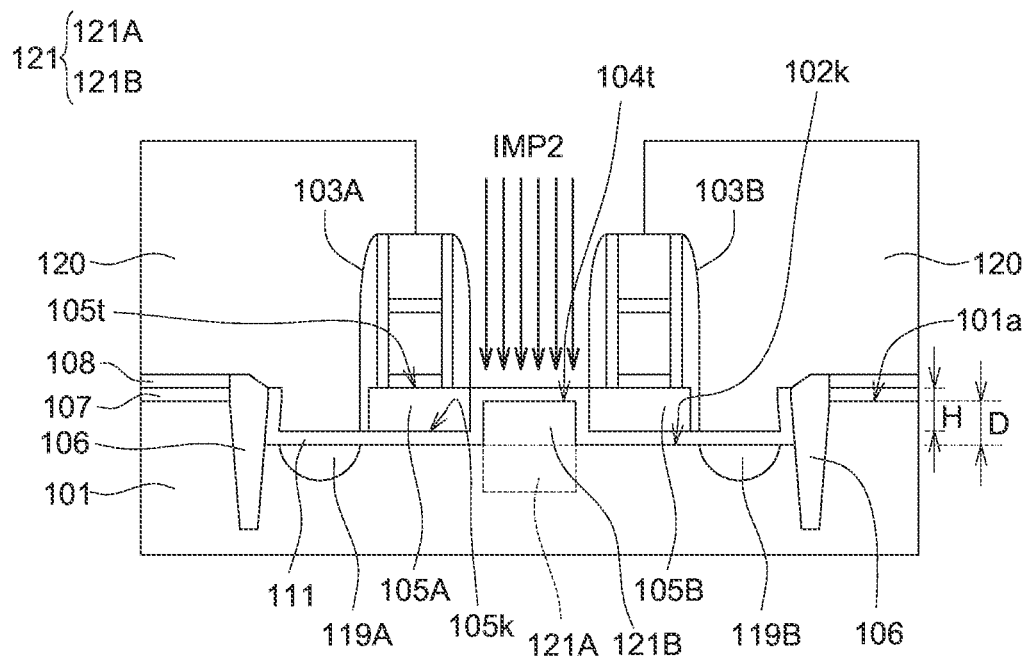

After stripping off the patterned photoresist layer 118, another patterned photoresist layer 120 is used to cover the substrate 101 and expose the area above the protrusion 104; and another ion implantation process IMP2 is performed to form a common source region 121 in the protrusion 104 and the portion of the semiconductor substrate 101 under the protrusion 104 (as shown in FIG. 1K). In the present embodiment, the common source region 121 includes a main body 121A and an extension part 121B. Wherein, the extension part 121B may be formed by the doped protrusion 104; and the main body 121A may be formed by a doped region of the semiconductor substrate 101 under the extension part 121B (under the bottom surface 102k of the recess 102). The main body 121A is adjacent to the base 105k of the first floating gate 105A and the second floating gate 105B.

The extension part 121B of the common source region 121 extends upward from the bottom surface 102k of the recess 102 beyond the base 105k of the first floating gate 105A and the second floating gate 105B, and is adjacent to the sidewalls of the first floating gate 105A and the second floating gate 105B. The top surface of the common source region 121 (the top surface 104t of the protrusion 104) is substantially coplanar with the substrate surface 101. The distance H from the base 105k to the top 105t of the first floating gate 105A and the second floating gate 105B is substantially less than or equal to the depth D of the recess 102. The doping concentration of the extension part 121B is higher than the doping concentration of the main body 121A.

Next, an erase gate 122 is formed above the extension 121B of the common source region 121, adjacent to the first floating gate 105A, the second floating gate 105B, the first control gate 103A and the second control gate 103B, wherein the erase gate 122 is electrically isolated from the semiconductor substrate 101 (including the common source region 121), the first floating gate 105A and the second floating gate 105B, by the gate dielectric layer 111 and the spacer 117.

A first word line 123A is formed in the first sub-recess 102A to be adjacent to the first floating gate 105A and the first control gate 103A; a second word line 123B is formed in the second sub-recess 102B to be adjacent to the second floating gate 105B and the second control gate 103B. Wherein, the first word line 123A and the second word line 123B are electrically isolated from the semiconductor substrate 101 (including the common source region 121), the first floating gate 105A and the second floating gate 105B by the gate dielectric layer 111 and the spacer 117.

The first floating gate 105A (including a portion of the gate dielectric layer 111), the first control gate 103A, the first drain region 119A and the common source region 121 collectively form a first memory cell 130A; and the second floating gate 105B (including another portion of the gate dielectric layer 111), the second control gate 103B, the second drain region 119B and the common source region 121 collectively form a second memory cell 130B.

Since the common source region 121 includes both the extension 121B protruding beyond the base 105k of the first floating gate 105A and the second floating gate 105B and the main body 121A located below the base 105k, thus the cross-sectional area of the common source region 121 can be substantially enlarged in comparison with the prior art NVM memory cells. Such that, the conduction current of the common source region 121 can be increased; the resistance of the common source region 121 can be reduced; and the negative impact of source load effect against to the memory cells that (not fully shown) share the common source region 121 can be relatively reduced.

Figure 1L:
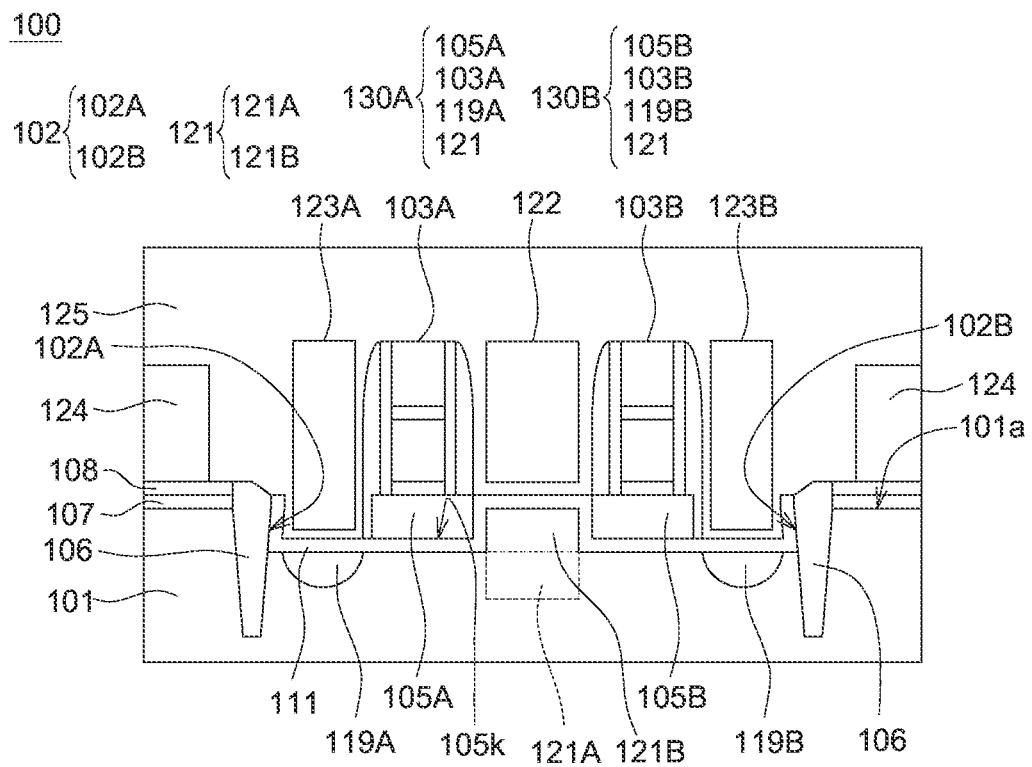

Subsequently, a plurality of downstream manufacturing processes are performed, for example to form a logic gate structure 124 in a logic region of the semiconductor substrate 101; to form an inner dielectric layer 125 covering the substrate surface 101a; and to form metal interconnects (not shown) in the inner dielectric layer 125, so as to complete the preparation of the NVM device 100 as shown in FIG. 1L.

In accordance with the aforementioned embodiments of the present disclosure, an NVM device and the method for fabricating the same are provided, in which a recess is formed in a semiconductor substrate, and a floating gate is then formed on the bottom surface of the recess. Next, a control gate is formed on the floating gate; and a common source region and a drain region are formed in the portion of the semiconductor substrate disposed in the recess, so as to make the common source region having a main body and an extension part. Wherein the main body is disposed under the bottom surface of the recess, and the extension part extends upward from the bottom surface of the recess beyond the base of the floating gate to be adjacent to the side wall of the floating gate. Whereby, at least one memory cell is formed in the semiconductor substrate.

Since the extension part protruding from the bottom surface of the recess can substantially enlarge the cross-sectional area of the source region of each memory cell, thus the conduction current of the source region can be increased, and the resistance of the source region can be reduced. When a plurality of memory cells are connected in series with their respective source regions to form a common source line, the negative impact of the source loading effect to the stability of each memory cell can be relatively reduced. In some embodiments, the doping concentration of the extension part of each memory cell can be further increased to reduce the resistance of the common source line, further reduce the source loading effect, and improve the performance of the NVM device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An non-volatile memory (NVM) device, comprising:
   a semiconductor substrate, having a substrate surface and a recess extending downward from of the substrate surface;
   a first floating gate, disposed in the recess, having a base and a sidewall connecting to the base, and electrically isolated from the semiconductor substrate;
   a first control gate, disposed on and adjacent to the first floating gate, and electrically isolated from the semiconductor substrate and the first floating gate;
   a first drain region, disposed in a portion of the semiconductor substrate that is located in the recess; and
   a common source region, formed in the portion of the semiconductor substrate the recess, disposed adjacent to the first floating gate and comprising:
      a main body, disposed below a bottom surface of the recess and adjacent to the base; and
      an extension part, extending upward from the bottom surface beyond the base to be adjacent to the side wall, wherein the extension part has a top surface that is coplanar with the substrate surface.

2. The NVM device according to claim 1, wherein the extension part has a doping concentration higher than that of the main bod.

3. The NVM device according to claim 1, wherein a distance from the base to a top of the first floating gate connecting to the sidewall is less than or equal to a depth of the recess.

4. The NVM device according to claim 1, further comprising:
   a second floating gate, disposed in the recess, adjacent to the first floating gate and the common source region, and electrically isolated from the semiconductor substrate and the first floating gate; and
   a second control gate, disposed on and adjacent to the second floating gate, and electrically isolated from the semiconductor substrate, the first floating gate and the second floating gate respectively.

5. The NVM device according to claim 4, further comprising an erase gate disposed between the first floating gate and the second floating gate, adjacent to the common source region, and electrically isolated from the semiconductor substrate.

6. The NVM device according to claim 1, further comprising a spacer, disposed on a sidewall of the control gate and covering a top of the first floating gate.

7. The NVM device according to claim 1, wherein the main body and the extension part comprise a semiconductor material selected from a group consisting of silicon (Si), germanium (Ge), gallium arsenide (GaAs) and arbitrary combinations thereof.

8. The NVM device according to claim 1, further comprising a gate dielectric layer, wherein the first floating gate is electrically isolated from the semiconductor substrate by a portion of the gate dielectric layer covering the recess.

9. The NVM device according to claim 8, wherein the gate dielectric layer is made of a dielectric material selected from a group consisting of silicon dioxide ($SiO_2$), silicon nitride (SiN), silicon oxynitride (SiNO), oxide ($HfO_2$), aluminum oxide ($AlO_x$) and arbitrary combinations thereof.

10. The NVM device according to claim 1, wherein the first control gate comprises a dielectric memory layer disposed on the first floating gate; and the dielectric memory layer comprises at least one composite layer selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride, aluminum oxide, silicon nitride, silicon oxide, silicon (TANOS) structure and a metal-high-k bandgap-engineered silicon-oxide-nitride-oxide-silicon (MA BE-SONOS) structure and the arbitrary combinations thereof.

11. A method for fabricating an NVM device, comprising:
   providing a semiconductor substrate having a substrate surface and a recess extending downward from of the substrate surface;
   forming a floating gate in the recess to make the floating gate having a base and a sidewall connecting to the base, and electrically isolated from the semiconductor substrate, comprises:
      performing an etching process to form the recess in the semiconductor substrate and left a protrusion extending upwards from a bottom surface of the recess;

forming a gate dielectric layer to cover the bottom surface and the protrusion;

forming a first conductor layer to cover the gate dielectric layer; and patterning the first conductive layer to form the floating gate;

forming a control gate, disposed on and adjacent to the floating gate, and electrically isolated from the semiconductor substrate and the first floating gate;

forming a drain region in a portion of the semiconductor substrate that is located in the recess; and forming a common source region in the portion of the semiconductor substrate in the recess, to make the common source region adjacent to the floating gate and comprising:

a main body, disposed below the bottom surface of the recess and adjacent to the base; and an extension part, extending upward from the bottom surface beyond the base to be adjacent to the side wall.

12. The method according to claim 11, wherein the main body and the extension part comprise a semiconductor material selected from a group consisting of Si, Ge, GaAs and arbitrary combinations thereof.

13. The method according to claim 11, wherein the step of forming the control gate comprises:

forming a dielectric memory layer to cover the floating gate and the protrusion;

forming a second conductive layer to cover the dielectric memory layer;

patterning the second conductive layer to form the control gate on the floating gate; and forming at least one spacer on the control gate and covers a top of the floating gate.

14. The method according to claim 13, wherein the dielectric memory layer comprises at least one composite layer selected from a group consisting of an ONONO structure, a SONOS structure, a BE-SONOS structure, a TANOS structure and a MA BE-SONOS structure and the arbitrary combinations thereof.

15. The method according to claim 13, wherein the step of forming the drain region comprises performing a first ion implantation process on a portion of the bottom surface not covered by the floating gate after the floating gate is formed.

16. The method according to claim 13, wherein the step of forming the source region comprises performing a second ion implantation process on the protrusion to form the extension part in the protrusion and form the main body under the protrusion.

17. The method according to claim 16, wherein the extension part has a doping concentration higher than that of the main bod.

18. The method according to claim 11, further comprising forming an erase gate on the common source region to make the erase gate electrically isolated from the semiconductor substrate by the gate dielectric layer.

* * * * *